United States Patent
Zang et al.

(10) Patent No.: US 11,302,727 B2
(45) Date of Patent: Apr. 12, 2022

(54) PIXEL, ASSOCIATED IMAGE SENSOR, AND METHOD

(71) Applicant: OmniVision Technologies, Inc., Santa Clara, CA (US)

(72) Inventors: Hui Zang, San Jose, CA (US); Qin Wang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/689,938

(22) Filed: Nov. 20, 2019

(65) Prior Publication Data

US 2021/0151487 A1 May 20, 2021

(51) Int. Cl.
| | |
|---|---|
| *H01L 27/14* | (2006.01) |
| *H01L 27/146* | (2006.01) |
| *H01L 29/78* | (2006.01) |
| *H01L 29/66* | (2006.01) |
| *H01L 29/423* | (2006.01) |

(52) U.S. Cl.
CPC .. *H01L 27/14614* (2013.01); *H01L 27/14645* (2013.01); *H01L 29/4236* (2013.01); *H01L 29/66666* (2013.01); *H01L 29/7827* (2013.01)

(58) Field of Classification Search
CPC ......... H01L 27/14614; H01L 29/66666; H01L 27/14645; H01L 29/7827; H01L 29/4236; H01L 29/78642; H01L 25/167; H01L 31/107; H01L 27/14643–14663; H01L 31/04–078; H01L 31/0216–02168

USPC ......................................................... 257/292
See application file for complete search history.

(56) References Cited

U.S. PATENT DOCUMENTS

| | | | |
|---|---|---|---|
| 9,385,157 B2 | 7/2016 | Jung et al. | |
| 10,825,850 B2 * | 11/2020 | Fukuoka | H01L 29/105 |
| 2009/0303371 A1 * | 12/2009 | Watanabe | H01L 27/14887 348/311 |
| 2011/0089311 A1 | 4/2011 | Venezia et al. | |
| 2012/0242875 A1 * | 9/2012 | Nakamura | H01L 27/14689 348/294 |
| 2013/0175582 A1 * | 7/2013 | Ihara | H01L 27/14612 257/222 |

(Continued)

FOREIGN PATENT DOCUMENTS

| | | |
|---|---|---|
| EP | 2487714 B1 | 12/2018 |
| JP | 2010073840 A * | 4/2010 |

*Primary Examiner* — Mohammad M Hoque
(74) *Attorney, Agent, or Firm* — Lathrop GPM LLP (57) ABSTRACT

A pixel includes a semiconductor substrate, a photodiode region, a floating diffusion region, and a dielectric layer. The substrate has a top surface forming a trench lined by the dielectric layer, and having a trench depth relative to a planar region of the top surface. The photodiode region is in the substrate and includes a bottom photodiode section beneath the trench and a top photodiode section adjacent to the trench, adjoining the bottom photodiode section, and extending toward the planar region to a photodiode depth less than the trench depth. The floating diffusion region is adjacent to the trench and has a junction depth less than the trench depth. A top region of the dielectric layer is between the planar region and the junction depth. A bottom region of the dielectric layer is between the photodiode depth and the trench depth, and thicker than the top region.

21 Claims, 4 Drawing Sheets

(56) References Cited

U.S. PATENT DOCUMENTS

| | | |
|---|---|---|
| 2015/0132882 A1 | 5/2015 | Hisanori |
| 2016/0013240 A1 | 1/2016 | Jung et al. |
| 2016/0343751 A1 | 11/2016 | Sze et al. |
| 2018/0061875 A1 | 3/2018 | Roy |
| 2020/0176500 A1* | 6/2020 | Sze .................. H01L 27/14603 |

* cited by examiner

FIG. 10

PIXEL, ASSOCIATED IMAGE SENSOR, AND METHOD

BACKGROUND

Camera modules in consumer devices such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode region, a floating diffusion region, and a transfer gate. The transfer gate controls current flow from the photodiode region to the floating diffusion region and may include a field-effect transistor. The electric potential of the photodiode region exceeds that of the floating diffusion region. Light reaching the photodiode region generates photoelectrons. Turning on the transfer gate forms a conducting channel that allows the accumulated photoelectrons to transfer or flow from photodiode region to the floating diffusion region. When the transfer gate is pulsed to an off-state, the potential barrier is higher than that of the photodiode region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally orientated with respect to the vertical direction perpendicular thereto that defines the direction of normally-incident reaching the pixel array. Such a horizontal orientation limits how much the pixel density can be decreased. Hence, one way to increase pixel density is to orient the photodiode, transfer gate, and floating diffusion in a direction that has a vertical component. Such transfer gates are examples of vertical transfer gates.

SUMMARY OF THE EMBODIMENTS

Problems with pixels with vertical transfer gates include electron transport lag and electron back-scattering. Embodiments disclosed herein ameliorate these problems.

In a first aspect, a pixel includes a semiconductor substrate, a photodiode region, a floating diffusion region, and a dielectric layer. The semiconductor substrate has a substrate top surface forming a trench extending into the semiconductor substrate. The trench has a trench depth relative to a planar region of the substrate top surface surrounding the trench. The photodiode region is in the semiconductor substrate and includes a bottom photodiode section beneath the trench and a top photodiode section. The top photodiode section (a) is adjacent to the trench, (b) adjoins the bottom photodiode section, (c) is implanted at a photodiode depth that is less than the trench depth relative to the planar region, and (d) extending toward and adjoining the bottom photodiode region. The floating diffusion region is in the semiconductor substrate, adjacent to the trench, and extends away from the planar region to a junction depth that is less than the trench depth. The dielectric layer lines the trench. A top region of the dielectric layer is between the planar region and the junction depth has a top thickness. A bottom region of the dielectric layer is between the photodiode depth and the trench depth, and has a bottom thickness that exceeds the top thickness.

In a second aspect, a pixel includes a semiconductor substrate, a photodiode region in the semiconductor substrate, a floating diffusion region in the semiconductor substrate, a dielectric layer lining the trench, and a gate-electrode material filling the trench. The semiconductor substrate has a substrate top surface forming a trench extending into the semiconductor substrate and has a trench depth relative to a planar region of the substrate top surface surrounding the trench. The photodiode region includes (i) a bottom photodiode section beneath the trench and (ii) a top photodiode section adjacent to the trench, beginning at a photodiode depth that is less than the trench depth, extending toward and adjoining the bottom photodiode region. The photodiode depth is relative to the planar region. The floating diffusion region is in the semiconductor substrate, adjacent to the trench, and extends away from the planar region to a junction depth that is less than the trench depth. The dielectric layer has a top region formed between the planar region and the junction depth, and a bottom region formed between the photodiode depth and the trench depth. The semiconductor substrate, the gate-electrode material, and the bottom region of the dielectric layer therebetween form a first capacitor having a first capacitance. The semiconductor substrate, the gate-electrode material, and the top region of the dielectric layer therebetween form a second capacitor having a second capacitance that exceeds the first capacitance.

In a third aspect, a transfer-gate fabrication method includes lining a surface of a trench with a first dielectric layer. The trench extends into a top surface of a semiconductor substrate and has a trench depth relative to a planar region of the top surface surrounding the trench. The semiconductor substrate includes a photodiode region adjacent to the trench. The photodiode region is formed at a photodiode depth and extending away from the planar region. The photodiode depth, relative to the planar region, is less than the trench depth. The method also includes covering a bottom region of the first dielectric layer with an organic layer. The bottom region extends from the trench depth to an etch depth that does not exceed the photodiode depth. The method also includes etching a top region of first dielectric layer at depths between the top surface and the etch depth, and depositing a second dielectric layer on the surface of the trench at depths between the planar region and the trench depth.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
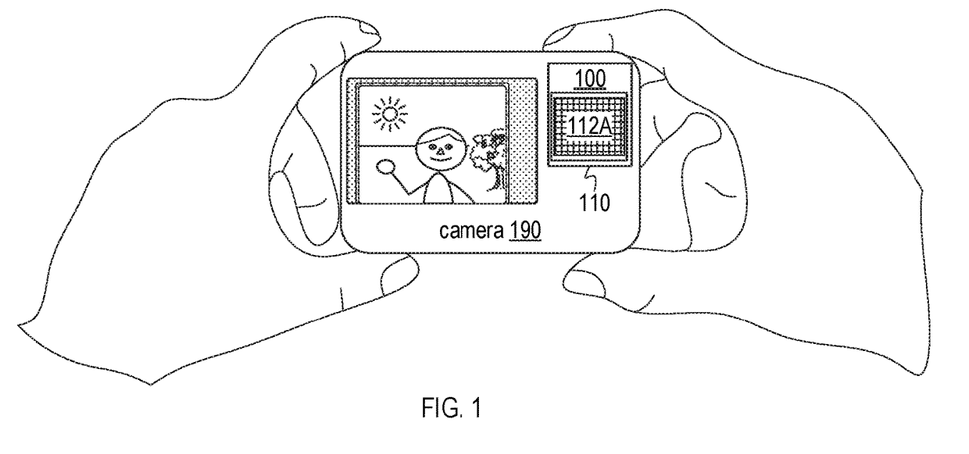
FIG. 1 depicts a camera imaging a scene.

FIG. 1 depicts a camera 190 imaging a scene. Camera 190 includes an image sensor 100, which includes a semiconductor substrate 110. Constituent elements of semiconductor substrate 110 may include silicon and germanium. Semiconductor substrate 110 includes a pixel array 112A. Image sensor 100 may part of a chip-scale package or a chip-on-board package.

Figure 2:
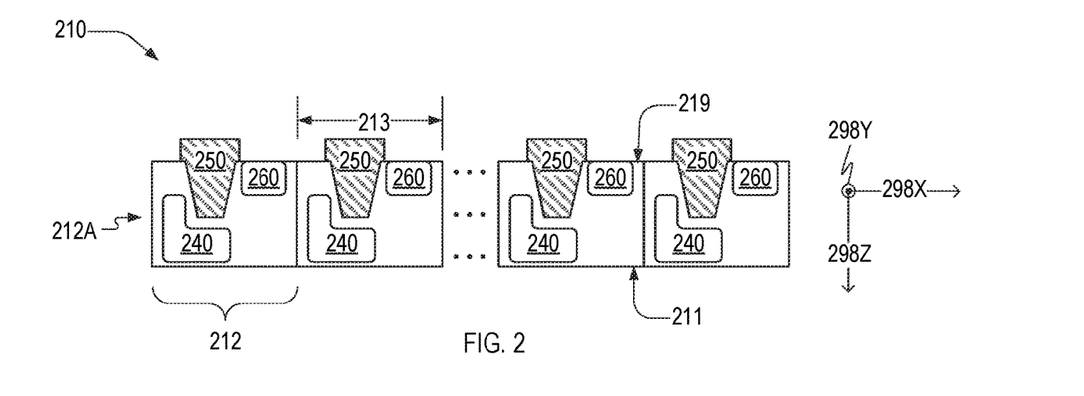
FIG. 2 is a cross-sectional schematic of a semiconductor substrate, which is an embodiment of the semiconductor substrate of the camera of FIG. 1.

FIG. 2 is a cross-sectional schematic of a semiconductor substrate 210, which is an example of semiconductor substrate 110, and includes at least one of silicon and germanium. The cross-section illustrated in FIG. 2 is parallel to a plane, hereinafter the x-z plane, formed by orthogonal directions 298X and 298Z, which are each orthogonal to direction 298Y. Herein, the x-y plane is formed by orthogonal directions 298X and 298Y, and planes parallel to the x-y plane are referred to as transverse planes. Unless otherwise specified, heights of objects herein refer to the object's extent in direction 298Z, or a direction 180° opposite thereto. Herein, reference to an axis x, y, or z or associated direction ±x, ±y, or ±z refers to directions 298X, 298Y, and 298Z respectively. Also, herein, a horizontal plane is parallel to the x-y plane, a width refers to an objects extension in the y direction, and vertical refers to the z direction.

Semiconductor substrate 210 has a bottom substrate surface 211 and a top substrate surface 219, each of which may be perpendicular to direction 298Z. Herein, top substrate surface 219 may be referred as the front side surface of semiconductor substrate 210. Herein, top substrate surface 219 may be referred to as the non-illuminated surface of semiconductor substrate 210 and bottom substrate surface 211 opposite to top substrate surface 219 may be referred to as the illuminated surface of semiconductor substrate 210. Semiconductor substrate 210 includes a plurality of pixels 212 that form a pixel array 212A, which is an example of pixel array 112A. The plurality of pixels 212 are arranged in a plurality of rows and columns in directions 298X and 298Y respectively. Pixel array 212A has a pixel pitch 213 in direction 298X. In direction 298Y pixel array 212A has pitch $P_y$ that, in embodiments, equals pixel pitch 213. In embodiments, pixel pitch 213 is less than 1.1 µm, for example, pixel pitch 213 may equal 0.9 µm.

Each pixel 212 includes a respective photodiode 240, a respective vertical transfer gate 250, and a respective floating diffusion region 260. Photodiode 240 of each pixel 212 is configured to generate and accumulate charges in respond to incoming light, for example entered from bottom substrate surface 211 of semiconductor substrate 210 (e.g., backside surface of semiconductor substrate 210) during an integration period of the image sensor. Electrical connection of photodiode 240 to floating diffusion region 260 depends on voltage applied to vertical transfer gate 250. Charges accumulated in photodiode 240 can be selectively transferred to floating diffusion region 260 depending on voltage applied to vertical transfer gate 250.

Figure 3:
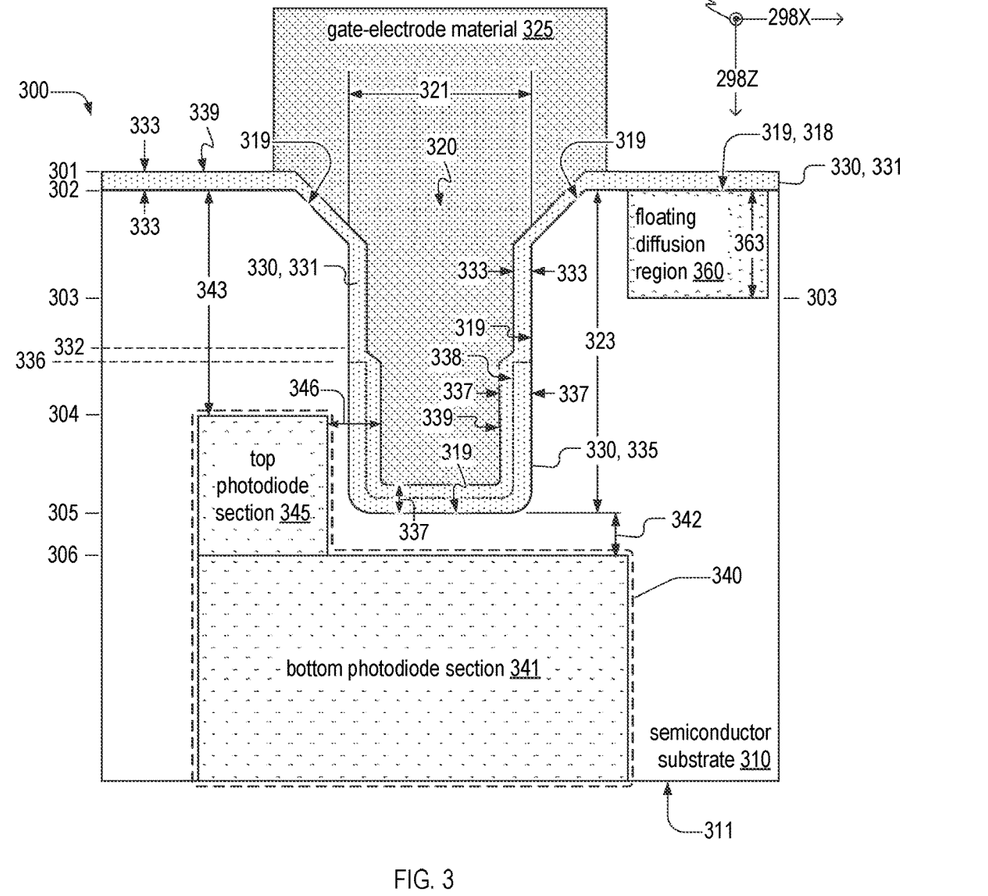
FIG. 3 is a cross-sectional schematic of a pixel, which is an embodiment of a pixel of the semiconductor substrate of FIG. 2.

FIG. 3 is a cross-sectional schematic of a pixel 300, which is an example of pixel 212. Pixel 300 is formed in a semiconductor substrate 310, which is an example of semiconductor substrate 210, FIG. 2. Pixel 300 includes a trench 320, a dual-capacitance dielectric layer 330 lining trench 320, a photodiode region 340, a floating diffusion region 360. In embodiments, semiconductor substrate 310 is p-doped, photodiode region 340 is n-doped, and floating diffusion region 360 is n⁺-doped. In embodiments, floating diffusion region 360 has a dopant concentration between $10^{19}$ and $5 \times 10^{20}$ charge carriers per cubic centimeter.

Semiconductor substrate 310 has a surface 319 that forms trench 320. Surface 319 includes a planar region 318 surrounding trench 320. Trench 320 extends into semiconductor substrate 310 to a trench depth 323 relative to planar region 318. In embodiments, trench depth 323 is between 0.1 and 0.9 micrometers. In at least one of directions 298X and 298Y, trench 320 has a width 321, which may be between fifty nanometers and 0.3 micrometers. In embodiments, trench 320 has a non-uniform width between planar region 318 and its bottom. Accordingly, width 321 may be a width of trench 320 at a depth equal to one-half of trench depth 323. Semiconductor substrate 310 has a bottom substrate surface 311, which is an example of bottom substrate surface 211, FIG. 2.

Photodiode region 340 is an example of photodiode region 240, FIG. 2, and includes a bottom photodiode section 341 beneath trench 320 and a top photodiode section 345 adjacent to trench 320. Top photodiode section 345 is formed at a photodiode depth 343, with respect to planar region 318, is less than the trench depth 323, and extends toward bottom surface 311 to a horizontal plane 306. Bottom photodiode section 341 adjoins top photodiode section 345 at horizontal plane 306 and extends way from planar region 318 toward bottom surface 311. Horizontal plane 306 is perpendicular to direction 298Z.

The bottom of trench 320 is formed deeper into the semiconductor substrate 310 than the top photodiode section 345 relative to the planar region 318 such that a portion of the trench 320 is overlapped with top photodiode section 345. Bottom photodiode section 341 is separated from surface 319 by a distance 342 in the x-y plane. Top photodiode section 345 is separated from surface 319 by a distance 343 in vertical directions (e.g., along direction 298Z). Top photodiode section 345 is separated from surface 319 by a distance 346 in horizontal directions.

In embodiments, each of distances 342 and 346 are between thirty nanometers and three-hundred nanometers. Floating diffusion region 360 is formed in semiconductor substrate 310, adjacent to trench 320 and extends away from planar region 318 to a junction depth 363 that is less than trench depth 323.

Dual-capacitance dielectric layer 330 lines trench 320, has a top dielectric surface 339, and a thin region 331 and a thick region 335 defined by ranges of distances from planar region 318 parallel to direction 298Z. In embodiments, dual-capacitance dielectric layer 330 has relative permittivity greater than or equal to that of silicon dioxide, which enables layer 330 to have sufficient capacitance attracting electrons to floating diffusion region 360 during charge transfer operation.

In addition to horizontal plane 306, FIG. 3 also denotes five horizontal planes 301-305, each of which is perpendicular to direction 298Z. Plane 301 corresponds to a top surface of dual-capacitance dielectric layer 330 above planar region 318. Plane 302 includes planar region 318. Planes 302 and 303 are vertically separated by junction depth 363. Planes 302 and 304 are vertically separated by photodiode depth 343. Planes 302 and 305 are vertically separated by trench depth 323. Planes 305 and 306 are separated by distance 342. Aforementioned distance 346 may be in a plane between planes 304 and 305.

Thin region 331 is between plane 301 and a horizontal plane 332, which is either between planes 302 and 304 or coplanar with plane 304. Thick region is 335 is between plane 305 and a horizontal plane 336, which is between planes 305 and 332. In embodiments, horizontal plane 336 is coplanar with plane 304 and horizontal plane 332 is between planes 302 and 304. In embodiments, horizontal plane 332 is coplanar with plane 304 and horizontal plane 336 is between planes 304 and 305. In embodiments, both horizontal planes 332 and 336 are coplanar with plane 304 within fabrication tolerances.

Thin region 331 and thick region 335 have respective thicknesses 333 and 337, where, in embodiments, thickness 337 exceeds thickness 333. Since thin layers often lack uniform thicknesses, values of layer thicknesses disclosed herein may be represent an average thickness of the layer, such as an average thickness of the layer. In embodiments, thickness 333 is between two nanometers and ten nanometers. In an embodiment, thickness 333 is 7.5 nanometers. In embodiments, thickness 337 exceeds thickness 333 by a factor of at least two. In embodiments, the factor is between two and five.

In embodiments, thick region 335 includes a plurality of material layers. FIG. 3 denotes an intra-dielectric surface 338. Thick region 335 may include a first layer between surface 319 and intra-dielectric surface 338, and a second layer between intra-dielectric surface 338 and top dielectric surface 339. In embodiments, the first layer and the second layer are formed of the same material, such as silicon dioxide. In other embodiments, the first layer and the second layer are formed of the different materials. For example, the first layer may be formed of dielectric material having a dielectric constant greater than 3.9 (referred to as high-κ material) or relative permittivity greater than or equal to that of silicon dioxide, such as aluminum oxide ($Al_2O_3$), Hafnium oxide ($HfO_2$), Tantalum oxide ($Ta_2O_5$), Zirconium dioxide ($ZrO_2$) or a combination thereof, and the second layer may be formed of silicon dioxide. In embodiments, thin region 331 and thick region 335 have respective dielectric constants $\kappa_{331}$ and $\kappa_{335}$, respective thicknesses $t_{331}$ and $t_{335}$ and respective area-normalized capacitances $\kappa_{331}/t_{331}$ and $\kappa_{335}/t_{335}$, wherein $\kappa_{331}/t_{331}$ exceeds $\kappa_{335}/t_{335}$. Area-normalized capacitance $\kappa_{335}/t_{335}$ may be a normalized series capacitance, e.g., when thick region 335 includes a plurality of material layers formed of different materials, and $\kappa_{335}^{-1}$ is a sum of reciprocals of dielectric constants of the plurality of material layers.

In embodiments, pixel 300 includes a gate-electrode material 325 filling trench 320. Trench 320, dual-capacitance dielectric layer 330, and gate-electrode material 325 form a vertical transfer gate electrically connected to photodiode region 340 via the thick region 335 and top photodiode section 345. Dual-capacitance dielectric layer 330 and gate-electrode material 325 function as a transfer gate of pixel 300, which is an example of vertical transfer gate 250, FIG. 2. Gate electrode material 325 includes suitable conductive material such as polysilicon or metal.

It is appreciated by those skilled in the art that vertical transfer gate 250 may be modeled as a parallel plate capacitor with capacitance $C=(\kappa\varepsilon_0 A)/t$, where $\kappa=\varepsilon/\varepsilon_0$, A represents the capacitor area or the area of corresponding section of vertical transfer gate 250, $\varepsilon_0$ is the permittivity of free space i.e., $8.854 \times 10^{12}$ farads per meter, K represents the dielectric constant (relative permittivity) of dual-capacitance dielectric layer 330-capacitance, and t represents the thickness of the parallel plate capacitor i.e., the thickness of dual-capacitance dielectric layer 330 of corresponding capacitor area. Area A is, for example, an area of a patch of thin region 331 or thick region 335 having a surface normal perpendicular to surface 319.

In other words, the capacitance of vertical transfer gate 250 is related to the thickness and the material composition of dual-capacitance dielectric layer 330. The thickness of thin region 331 and the thickness of thick region 335 as well as the material composition of thin region 331 and thick region 335 are configured such that the capacitance associated with thin region 331 is always greater than the capacitance associated thick region 335 to (i) facilitate charge transfer (e.g., photoelectron transfer) from top photodiode region 345 to floating diffusion region 360 during charge transfer operation and (ii) reduce image lag. The capacitance associated with thin region 331 is the capacitance of a capacitor formed by semiconductor substrate 310, gate-electrode material 325, and thin region 331 therebetween. Semiconductor substrate 310 and gate-electrode material 325 function as capacitor electrodes while thin region 331 functions as a capacitor dielectric. The capacitance associated with thick region 335 is the capacitance of a capacitor formed by semiconductor substrate 310, gate-electrode material 325, and thick region 335 therebetween. Semiconductor substrate 310 and gate-electrode material 325 function as capacitor electrodes while thick region 335 functions as a capacitor dielectric.

Figure 4:
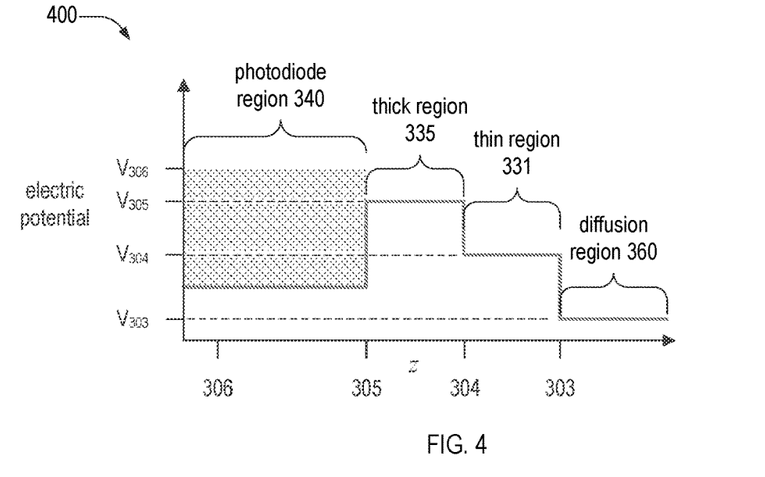
FIG. 4 is a schematic plot of electric potential vs. depth-in-pixel illustrating technical benefits of an embodiment of the pixel of FIG. 3.

FIG. 4 is a schematic plot 400 of electric potential vs. vertical position z illustrating technical benefits of an embodiment of pixel 300. In this embodiment, the boundary of thin region 331 and thick region 335 corresponds to photodiode depth 343 of photodiode region 340. Described in terms of planes 302, 304, and 332, in this embodiment, both horizontal planes 332 and 336 are coplanar with plane 304 to within fabrication tolerances. Plot 400 denotes electric potentials $V_{303}$-$V_{306}$ of charge carriers at respective planes 303-306 denoted in FIG. 5 when vertical transfer gate 250 is on (e.g., applied with a positive voltage), hence allowing photoelectrons to flow from photodiode region 340 to floating diffusion region 360.

Light incident on photodiode region 340 excite charge carriers therein to a conduction band of the doped semiconductor of photodiode region 340; the charge carriers are at electric potential $V_{306}$. The potential difference $\Delta\phi=(V_{305}-V_{303})$ between the bottom of trench 320 (plane 305), and floating diffusion region 360 (plane 303) creates an electric field that results in current flow between photodiode region 340 and floating diffusion region 360.

Dual-capacitance dielectric layer 330 includes thick region 335 and thin region 331, which results in a two-step voltage drop between photodiode region 340 and floating diffusion region 360, as plot 400 illustrates. When dual-capacitance dielectric layer 330 has a uniform thickness, the electric potential would be constant between planes 303 and 305. Disadvantages of such pixels include electron transport lag and electron back-scattering. Dual-capacitance dielectric layer 330 reduces each of these problems, e.g., when the ratio of thickness 337 to thickness 333 is between two and five. When this ratio exceeds five, either thickness 333 is too small, which results in current leakage, or thickness 337 is so large that the capacitance of layer 330 decreases; which degrades charge-transfer efficiency.

Figure 5:
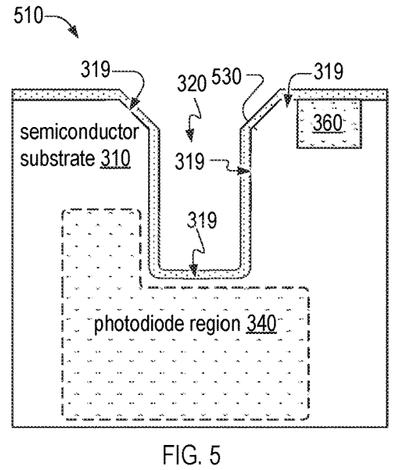
FIG. 5 is a cross-sectional schematic of a coated substrate, which is the semiconductor substrate of FIG. 3 with a dielectric layer thereon, in an embodiment.

FIGS. 5-8 illustrate intermediate substrates attained during an example process for manufacturing pixel 300. FIG. 5 is a cross-sectional schematic of a coated substrate 510, which is semiconductor substrate 310 with a dielectric layer 530 deposited on surface 319 and lining trench 320. In embodiments, dielectric layer 530 may be formed of silicon dioxide ($SiO_2$) or high κ material such as aluminum oxide ($Al_2O_3$), Hafnium oxide ($HfO_2$), Tantalum oxide ($Ta_2O_5$), Zirconium dioxide ($ZrO_2$). Dielectric layer 530 may be deposited into trench 320 by chemical vapor deposition (CVD) process, atomic layer deposition (ALD) process, or other suitable deposition method.

Figure 6:
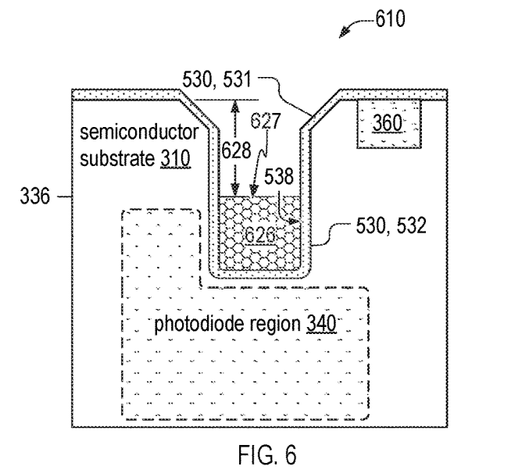
FIG. 6 is a cross-sectional schematic of a coated substrate of FIG. 5 with an organic layer partially filling a trench thereof, in an embodiment.

FIG. 6 is a cross-sectional schematic of a coated substrate 610, which is coated substrate 510 with the addition of an organic layer 626 in trench 320 such that part of dielectric layer 530, referred to as layer section 532, is between surface 319 and organic layer 626. Layer section 531 denotes the remaining part of dielectric layer 530 not covered by organic layer 626. Organic layer 626 has a top surface 627 at an etch depth 628 with respect to surface 319. In embodiments, etch depth 628 equals a distance between planes 302 and 336, FIG. 3. Layer section 532 has a surface 538, which is an example of intra-dielectric surface 338, FIG. 3. Organic layer 626 may be a self-planarizing organic material that includes at least one of carbon, hydrogen, oxygen, and optionally nitrogen, fluorine, and silicon, and form a planarized horizontal surface at top surface. Organic layer 626 may be formed from organic polymer.

Figure 7:
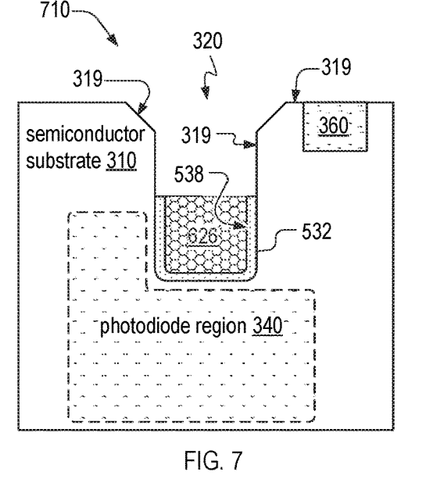
FIG. 7 is a cross-sectional schematic of the coated substrate of FIG. 6 after etching, in an embodiment.

FIG. 7 is a cross-sectional schematic of an etched substrate 710, which is coated substrate 610 after etching layer section 531. Etched substrate 710 includes layer section 532 between organic layer 626 and surface 319.

Figure 8:
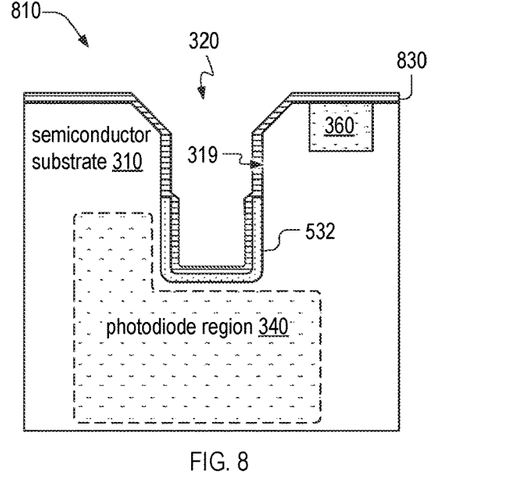
FIG. 8 is a cross-sectional schematic of the substrate of FIG. 7 after deposition of a layer thereon, in an embodiment.

FIG. 8 is a cross-sectional schematic of a coated substrate 810, which is etched substrate 710 after removal of organic layer 626 and subsequent deposition of a dielectric layer 830 on etched substrate 710. The combination of dielectric layer 830 and layer section 532 is an example of dual-capacitance dielectric layer 330, wherein its thickness configured to modulate the capacitance of different portion of vertical transfer gate (e.g., vertical transfer gate 250) to facilitate charge transfer.

Figure 9:
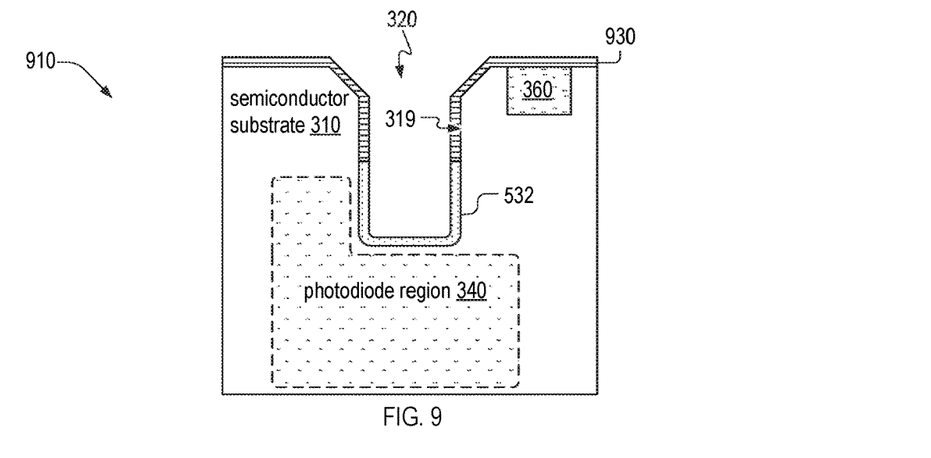
FIG. 9 is a cross-sectional schematic of the substrate of FIG. 7 after deposition of a layer thereon, in an embodiment

FIG. 9 is a cross-sectional schematic of a coated substrate 910, which, in embodiments, results from removing organic layer 626 from etched substrate 710 and depositing a dielectric layer 930 on etched substrate 710. Dielectric layer 930 differs from layer section 532 in at least one of their respective dielectric constants and respective thicknesses. The combination of dielectric layer 930 and layer section 532 is an example of dual-capacitance dielectric layer 330, wherein its thicknesses and dielectric constants are layers 532 and 910 are configured to modulate the capacitance of different portion of vertical transfer gate (e.g., vertical transfer gate 250) to facilitate charge transfer. In embodiments, layer section 532 and dielectric layer 930 have respective dielectric constants $\kappa_{532}$ and $\kappa_{930}$, respective thicknesses $t_{532}$ and $t_{930}$ and respective area-normalized capacitances $\kappa_{532}/t_{532}$ and $\kappa_{930}/t_{930}$, wherein $\kappa_{930}/t_{930}$ exceeds $\kappa_{532}/t_{532}$.

Figure 10:
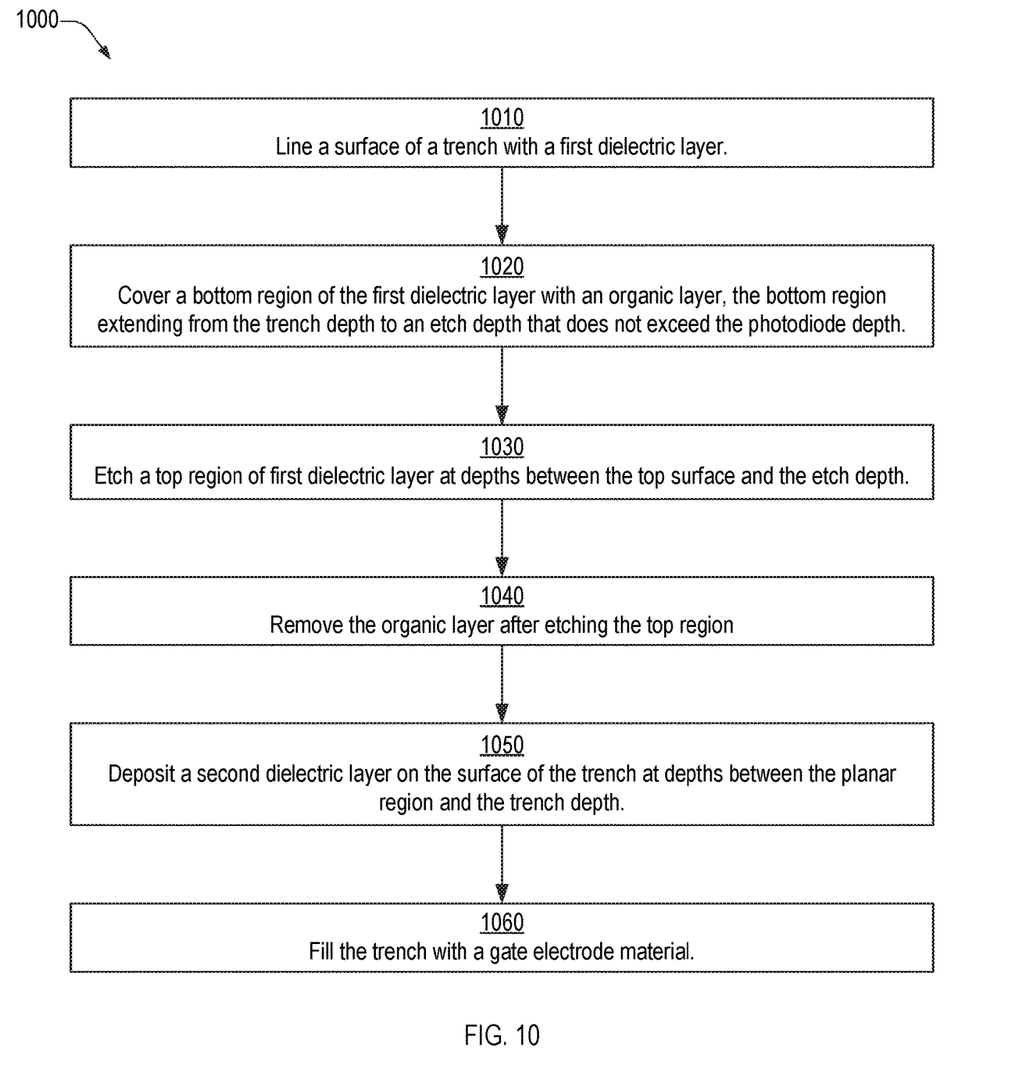
FIG. 10 is a flowchart illustrating a method for fabricating a transfer gate, in an embodiment.

FIG. 10 is a flowchart illustrating a method 1000 for fabricating a transfer gate. Method 1000 includes steps 1010, 1020, 1030, and 1050. In embodiments, method 1000 also includes at least one of steps 1040 and 1060.

Step 1010 includes lining a surface of a trench with a first dielectric layer. The trench extends into a top surface (e.g., a front side surface) of a semiconductor substrate and has a trench depth relative to a planar region of the top surface surrounding the trench. The semiconductor substrate includes a photodiode region, adjacent to the trench, that is implanted on the top surface of the semiconductor substrate by ion implantation and formed at a photodiode depth in the semiconductor substrate, relative to the planar region. The photodiode depth is less than the trench depth with respect to the planar region. In an example of step 1010, dielectric layer 530 is deposited on surface 319 of semiconductor substrate 310 such that dielectric layer 530 lines surface 319, which yields coated substrate 510, FIG. 5.

Step 1020 includes covering a bottom region of the first dielectric layer with an organic layer, the bottom region extending from the trench depth to an etch depth that does not exceed the photodiode depth relative to the planar region. That is, the distance between the planar region and the etch depth is less than the distance between the planar region and the depth of the top surface of top photodiode section. For example, the depth of top surface of organic layer 626 with respect to the planar region is less than the depth the top portion of photodiode region 340. In an example of step 1020, organic layer 626 is deposited in trench 320 of coated substrate 510 such that organic layer 626 covers layer section 532, which yields coated substrate 610, FIG. 6.

Step 1030 includes etching a top region of first dielectric layer (such as high-κ material or silicon dioxide) at depths between the top surface and the etch depth. In an example of step 1030, layer section 531 is etched to yield etched substrate 710, FIG. 7. Step 1040 includes removing the organic layer after etching the top region. In an example of step 1040, organic layer 626 is removed from etched substrate 710 by a dry etching, a wet etching or a combination of a dry and a wet etching process.

Step 1050 includes depositing a second dielectric layer, for example, silicon dioxide, on the surface of the trench at depths between the planar region and the trench depth. In embodiments, the second dielectric layer may be deposited conformally to the sidewall surface of trench. In a first example of step 1050, dielectric layer 830 is deposited on surface 319 and surface 538 to yield coated substrate 810, FIG. 8. In a second example of step 1050, dielectric layer 930 is deposited on surface 319 and surface 538 to yield coated substrate 910, FIG. 9.

Step 1060 includes filling the trench with a gate electrode material. In an example of step 1060, trench 320 of coated substrate is filled with gate-electrode material 325 to yield pixel 300.

Combinations of Features

Features described above as well as those claimed below may be combined in various ways without departing from the scope hereof. The following enumerated examples illustrate some possible, non-limiting combinations:

(A1) A pixel includes a semiconductor substrate, a photodiode region, a floating diffusion region, and a dielectric layer. The semiconductor substrate has a substrate top surface forming a trench extending into the semiconductor substrate. The trench has a trench depth relative to a planar region of the substrate top surface surrounding the trench. The photodiode region is in the semiconductor substrate and includes (i) a bottom photodiode section beneath the trench, (ii) a top photodiode section adjacent to the trench, beginning at a photodiode depth that is less than the trench depth, extending toward and adjoining the bottom photodiode region, the photodiode depth being relative to the planar region. The floating diffusion region is in the semiconductor substrate, adjacent to the trench, and extends away from the planar region to a junction depth that is less than the trench depth. The dielectric layer lines the trench. A top region of the dielectric layer is between the planar region and the junction depth has a top thickness. A bottom region of the dielectric layer is between the photodiode depth and the trench depth, and has a bottom thickness that exceeds the top thickness.

(A2) In any pixel (A1), the dielectric layer may have a relative permittivity greater than or equal to that of silicon dioxide.

(A3) In any pixels (A1) and (A2), the bottom region may include a plurality of material layers.

(A4) In any pixel (A3), the bottom region may include a first dielectric layer and a second dielectric layer, wherein the first dielectric layer and second dielectric layer are formed of different respective dielectric materials.

(In any pixel (A3), the bottom region may include a first dielectric layer and a second dielectric layer, wherein the first dielectric layer and second dielectric layer are formed of a same dielectric material.

(A6) In any of pixels (A1)-(A5), the bottom thickness may exceed the top thickness by at least a factor of two.

(A7) In any pixel (A6), the bottom thickness may exceed the top thickness by a factor between two and five.

(A8) In any of pixels (A1)-(A7), the top thickness may be between two nanometers and ten nanometers.

(A9) In any of pixels (A1)-(A8), the trench depth may be between 0.1 micrometers and 0.9 micrometers.

(A10) In any of pixels (A1)-(A9), trench may have a width between 0.05 micrometers and 0.3 micrometers in a plane parallel to the planar region.

(A11) In any of pixels (A1)-(A10), the semiconductor substrate may be p-doped, the photodiode region may be n-doped, and the floating diffusion region may be n$^+$-doped.

(A12) Any of pixels (A1)-(A11) may further include a gate-electrode material filling the trench. The trench, the dielectric layer, and the gate-electrode material form a vertical transfer gate electrically connected to the photodiode region via the bottom region and the top photodiode section.

(A13) In any pixel (A12), the gate-electrode material may include at least one of polysilicon and a metal.

(A14) An image sensor includes a plurality of any of pixels (A1)-(A13). For each pixel of the plurality of pixels, the semiconductor substrate thereof is part of a same semiconductor substrate of the image sensor.

(B1) A pixel includes a semiconductor substrate, a photodiode region in the semiconductor substrate, a floating diffusion region in the semiconductor substrate, a dielectric layer lining the trench, and a gate-electrode material filling the trench. The semiconductor substrate has a substrate top surface forming a trench extending into the semiconductor substrate and has a trench depth relative to a planar region of the substrate top surface surrounding the trench. The photodiode region includes (i) a bottom photodiode section beneath the trench and (ii) a top photodiode section adjacent to the trench, beginning at a photodiode depth that is less than the trench depth, extending toward and adjoining the bottom photodiode region. The photodiode depth is relative to the planar region. The floating diffusion region is in the semiconductor substrate, adjacent to the trench, and extends away from the planar region to a junction depth that is less than the trench depth. The dielectric layer has a top region formed between the planar region and the junction depth, and a bottom region formed between the photodiode depth and the trench depth.

(B2) In any pixel (B1), the semiconductor substrate, the gate-electrode material, and the bottom region therebetween form a first capacitor having a first capacitance and the semiconductor substrate, the gate-electrode material, and the top region therebetween form a second capacitor having a second capacitance that exceeds the first capacitance.

(B3) In any pixel (B1), the bottom region may be formed of a first dielectric having a first dielectric constant, and the top region may be formed of a second dielectric having a second dielectric constant that exceeds the first dielectric constant.

(B4) In any of pixels (B1), (B2), and (B3) the bottom region may include a plurality of material layers.

(C1) A transfer-gate fabrication method includes lining a surface of a trench with a first dielectric layer. The trench extends into a top surface of a semiconductor substrate and has a trench depth relative to a planar region of the top surface surrounding the trench. The semiconductor substrate includes a photodiode region adjacent to the trench and extends toward the planar region to a photodiode depth, relative to the planar region, that is less than the trench depth. The method also includes covering a bottom region of the first dielectric layer with an organic layer. The bottom region extends from the trench depth to an etch depth that does not exceed the photodiode depth. The method also includes etching a top region of first dielectric layer at depths between the top surface and the etch depth, and depositing a second dielectric layer on the surface of the trench at depths between the planar region and the trench depth. In the bottom region, the first dielectric layer and a portion of the second dielectric layer adjacent thereto has an effective dielectric constant $\kappa_b$ and a thickness $d_b$. In the top region, the second dielectric layer has a dielectric constant $\kappa_t$ and a thickness $d_t$. Quotient $\kappa_t/d_t$ may exceed quotient $\kappa_b/d_b$.

(C2) Method (C1) may include removing the organic layer after etching the top region.

(C3) Any of methods (C1) and (C2) may include filling the trench with a gate electrode material.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel comprising:
   a semiconductor substrate having a substrate top surface forming a trench extending into the semiconductor substrate and having a trench depth relative to a planar region of the substrate top surface surrounding the trench;
   a floating diffusion region in the semiconductor substrate, adjacent to the trench, and extending away from the planar region to a junction depth that is less than the trench depth;
   a photodiode region in the semiconductor substrate and including
      (i) a bottom photodiode section beneath the trench and having a first conductive type, and
      (ii) a top photodiode section having the first conductive type and being located adjacent to the trench, beginning at a photodiode depth relative to the planar region, and extending toward and adjoining the bottom photodiode section, the photodiode depth being less than both (i) the trench depth and (ii) a depth of the bottom photodiode section relative to the planar region,
   in a cross-sectional plane perpendicular to the substrate top surface and including the trench, the photodiode region, and the floating diffusion region, the top photodiode section being on a side of the trench opposite the floating diffusion region;
   and
   a dielectric layer lining the trench, a top region of the dielectric layer between the planar region and the junction depth having a top thickness, a bottom region of the dielectric layer between the photodiode depth and the trench depth having a bottom thickness that exceeds the top thickness;
   the bottom region including (a) a first dielectric layer that (i) does not cover the planar region and (ii) is in direct contact with a bottom inner wall and lower sidewalls of the trench, and (b) a second dielectric layer that (i) lines the trench and continuously spans between the planar region and the first dielectric layer such that it covers at least part of the planar region, (ii) is at least part of the top region of the dielectric layer, and (iii) covers the first dielectric layer.

2. The pixel of claim 1, the dielectric layer having a relative permittivity greater than or equal to that of silicon dioxide.

3. The pixel of claim 1, the lower sidewalls of the trench being between the photodiode depth and the trench depth.

4. The pixel of claim 1, wherein the first dielectric layer and the second dielectric layer are formed of a same dielectric material.

5. The pixel of claim 1, wherein the first dielectric layer and the second dielectric layer are formed of different respective dielectric materials.

6. The pixel of claim 1, each of the bottom thickness and the top thickness being in a same direction, the bottom thickness exceeding the top thickness by at least a factor of two.

7. The pixel of claim 6, the bottom thickness exceeding the top thickness by a factor of between two and five.

8. The pixel of claim 1, the top thickness being between two nanometers and ten nanometers.

9. The pixel of claim 1, the trench depth being between 0.1 micrometers and 0.9 micrometers.

10. The pixel of claim 1, the trench having a width between 0.05 micrometers and 0.3 micrometers in a plane parallel to the planar region.

11. The pixel of claim 1, the semiconductor substrate being p-doped, the photodiode region being n-doped, and the floating diffusion region being $n^+$-doped.

12. The pixel of claim 1, further comprising a gate-electrode material filling the trench; the trench, the dielectric layer, and the gate-electrode material forming a vertical transfer gate electrically connected to the photodiode region via the bottom region and the top photodiode section.

13. The pixel of claim 12, the gate-electrode material including at least one of polysilicon and a metal.

14. An image sensor comprising a plurality of pixels of claim 1, for each pixel of the plurality of pixels, the semiconductor substrate thereof being part of a same semiconductor substrate of the image sensor.

15. The pixel of claim 1,
   a minimum distance between (a) the top photodiode section and (b) a region of the substrate top surface forming the trench being between thirty nanometers and three-hundred nanometers,
   the depth of the bottom photodiode section exceeding the trench depth by between thirty nanometers and three-hundred nanometers such that, beneath the trench and in a direction perpendicular to the substrate top surface, no part of the photodiode region is between the bottom photodiode section and the trench.

16. The pixel of claim 1, respective minimum distances between each of (i) the bottom photodiode section and the trench and (ii) the top photodiode section and the trench being greater than zero.

17. A pixel comprising:
   a semiconductor substrate having a substrate top surface forming a trench extending into the semiconductor substrate and having a trench depth relative to a planar region of the substrate top surface surrounding the trench;
   a floating diffusion region in the semiconductor substrate, adjacent to the trench, and extending away from the planar region to a junction depth that is less than the trench depth; and a photodiode region in the semiconductor substrate and including
  (i) a bottom photodiode section beneath the trench and having a first conductive type, and
  (ii) a top photodiode section having the first conductive type and being located adjacent to the trench, beginning at a photodiode depth relative to the planar region, and extending toward and adjoining the bottom photodiode section, the photodiode depth being less than both (i) the trench depth and (ii) a depth of the bottom photodiode section relative to the planar region,
  in a cross-sectional plane perpendicular to the substrate top surface and including the trench, the photodiode region, and the floating diffusion region, the top photodiode section being on a side of the trench opposite the floating diffusion region;
a dielectric layer lining the trench having a top region formed between the planar region and the junction depth, and a bottom region formed between the photodiode depth and the trench depth; and
a gate-electrode material filling the trench;
wherein the semiconductor substrate, the gate-electrode material, and the bottom region therebetween form a first capacitor having a first capacitance;
wherein the semiconductor substrate, the gate-electrode material, and the top region therebetween form a second capacitor having a second capacitance that exceeds the first capacitance,
the bottom region including (a) a first dielectric layer that (i) does not cover the planar region and (ii) is in direct contact with a bottom inner wall and lower sidewalls of the trench, and (b) a second dielectric layer that (i) lines the trench and continuously spans between the planar region and the first dielectric layer such that it covers at least part of the planar region, (ii) is at least part of the top region of the dielectric layer, and (iii) covers the first dielectric layer.

18. The pixel of claim 17, the first dielectric layer having a first dielectric constant, the second dielectric having a second dielectric constant that exceeds the first dielectric constant.

19. The pixel of claim 17, the lower sidewalls of the trench being between the photodiode depth and the trench depth.

20. The pixel of claim 17,
  a minimum distance between (a) the top photodiode section and (b) a region of the substrate top surface forming the trench being between thirty nanometers and three-hundred nanometers,
  the depth of the bottom photodiode section exceeding the trench depth by between thirty nanometers and three-hundred nanometers such that, beneath the trench and in a direction perpendicular to the substrate top surface, no part of the photodiode region is between the bottom photodiode section and the trench.

21. The pixel of claim 17, respective minimum distances between each of (i) the bottom photodiode section and the trench and (ii) the top photodiode section and the trench being greater than zero.

* * * * *